US009793345B1

(12) United States Patent
He et al.

(10) Patent No.: US 9,793,345 B1
(45) Date of Patent: Oct. 17, 2017

(54) SEMICONDUCTOR DEVICE

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/390,548

(22) Filed: Dec. 26, 2016

(30) Foreign Application Priority Data

Nov. 28, 2016 (TW) ............................... 105139066 A

(51) Int. Cl.
*H01L 29/66* (2006.01)
*H01L 21/336* (2006.01)
*H01L 29/06* (2006.01)
*H01L 29/423* (2006.01)
*H01L 27/02* (2006.01)

(52) U.S. Cl.
CPC ...... *H01L 29/0619* (2013.01); *H01L 27/0207* (2013.01); *H01L 29/4238* (2013.01)

(58) Field of Classification Search
CPC ................................................. H01L 29/0619
USPC ........ 438/454, 283, 195, 176, 157; 257/331, 257/365
See application file for complete search history.

(56) References Cited

U.S. PATENT DOCUMENTS

| 5,811,850 | A | 9/1998 | Smayling |
| 7,005,708 | B2 | 2/2006 | Mergens |
| 7,910,999 | B2* | 3/2011 | Lee ..................... H01L 27/0255 257/355 |
| 8,492,873 | B1* | 7/2013 | Tan ....................... H01L 21/761 257/490 |
| 9,245,996 | B2 | 1/2016 | Lin |

\* cited by examiner

*Primary Examiner* — Calvin Lee
(74) *Attorney, Agent, or Firm* — Winston Hsu

(57) ABSTRACT

A semiconductor device is disclosed, including a plurality of gate rings formed on a substrate and concentrically surrounding a first doped region formed in the substrate. The gate rings are equipotentially interconnected by at least a connecting structure. A second doped region is formed in the substrate, exposed from the space between adjacent gate rings. A third doped region is formed in the substrate adjacent to the outer perimeter of the outermost gate ring. The first doped region, the third doped region and the gate rings are electrically biased and the second doped regions are electrically floating.

20 Claims, 10 Drawing Sheets

SEMICONDUCTOR DEVICE

BACKGROUND OF THE INVENTION

1. Field of the Invention

The present invention generally relates to a semiconductor device, and more particularly, to a semiconductor device having stacked gates.

2. Description of the Prior Art

With the progress of technology, wireless communication has been developed rapidly and become the major form of communicating information in modern society. The wireless communication is performed between equipment having analog/radio frequency (RF) devices used for data converting, transmitting, receiving or amplifying, etc. The performances of the analog/RF devices therefore have significant influences on the transmitting speed and accuracy of the wireless communication.

However, the electrical characteristics of the analog/RF devices such as on-current ($I_{on}$)/transconductance (Gm), on-resistance ($R_{on}$), parasitic capacitance and breakdown voltage (BVD) usually have contrary trends. For example, in the process of performance optimization, attempts have been made to form analog/RF devices having parallel-connected gates in order to boost the on-current, but the parasitic capacitance is adversely increased. On the other hand, devices having serially-connected gates are proposed in order to reduce the parasitic capacitance, but the on-resistance is adversely increased.

In light of the above, there is still a need in the field to provide a device of which an optimized balance between these electrical characteristics aforesaid may be obtained and therefore an overall better performance may be achieved.

SUMMARY OF THE INVENTION

It is one objective of the present invention to provide a semiconductor device having a higher on-current, a lower parasitic capacitance and a lower on-resistance and thereby being advantageously applied in the analog/RD field.

The semiconductor device according to the present invention comprises a substrate and a first doping region formed in the substrate. A plurality of gate rings are formed on the substrate, concentrically surrounding the first doping region, and are spaced apart from each other by a second doping region formed in the substrate and interposed between each two adjacent gate rings. All of the gate rings are equipotentially interconnected by a connecting structure. A third doping region is formed in the substrate, adjacent to the outer perimeter of the outermost gate ring. A guard ring is formed adjacent to the outer perimeter of the third doping region, encompassing the gate rings. The first doping region, the third doping region and the gate rings are electrically connected to respective external bias voltages and the second doping region is electrically floating.

In one embodiment, the gate rings are square rings, and an even number of the connecting structures are arranged in a radial-symmetric manner on the substrate and around the first doping region, wherein each connecting structure extends from the innermost gate ring to the outermost gate ring.

In another embodiment, the connecting structure is formed structurally integrated with the gate rings. A gate contact plug is formed directly on each intersecting region of the gate rings and the connecting structure.

Instill another embodiment, the semiconductor device has four connecting structures, forming an X-shape or a cross shape joined at the first doping region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams showing a semiconductor device according to a first embodiment of the present invention, wherein:

FIG. 1 is a layout view;

FIG. 2 is a cross-sectional view taken along a line A-A' in FIG. 1; and

FIG. 3 is a cross-sectional diagram taken along a line B-B' in FIG. 1.

FIG. 8 is a schematic diagram showing a semiconductor device according to a second embodiment of the present invention, wherein:

The upper-left part is a layout view mainly showing the gate rings, the doping regions and the gate contact plugs and the source/drain contact plugs;

The upper-right part is a layout view further showing a metal layer wherein the connecting structures of the second embodiment are formed; and The lower part is a cross-sectional view taken along a line C-C' in the layout view.

Figure 9:
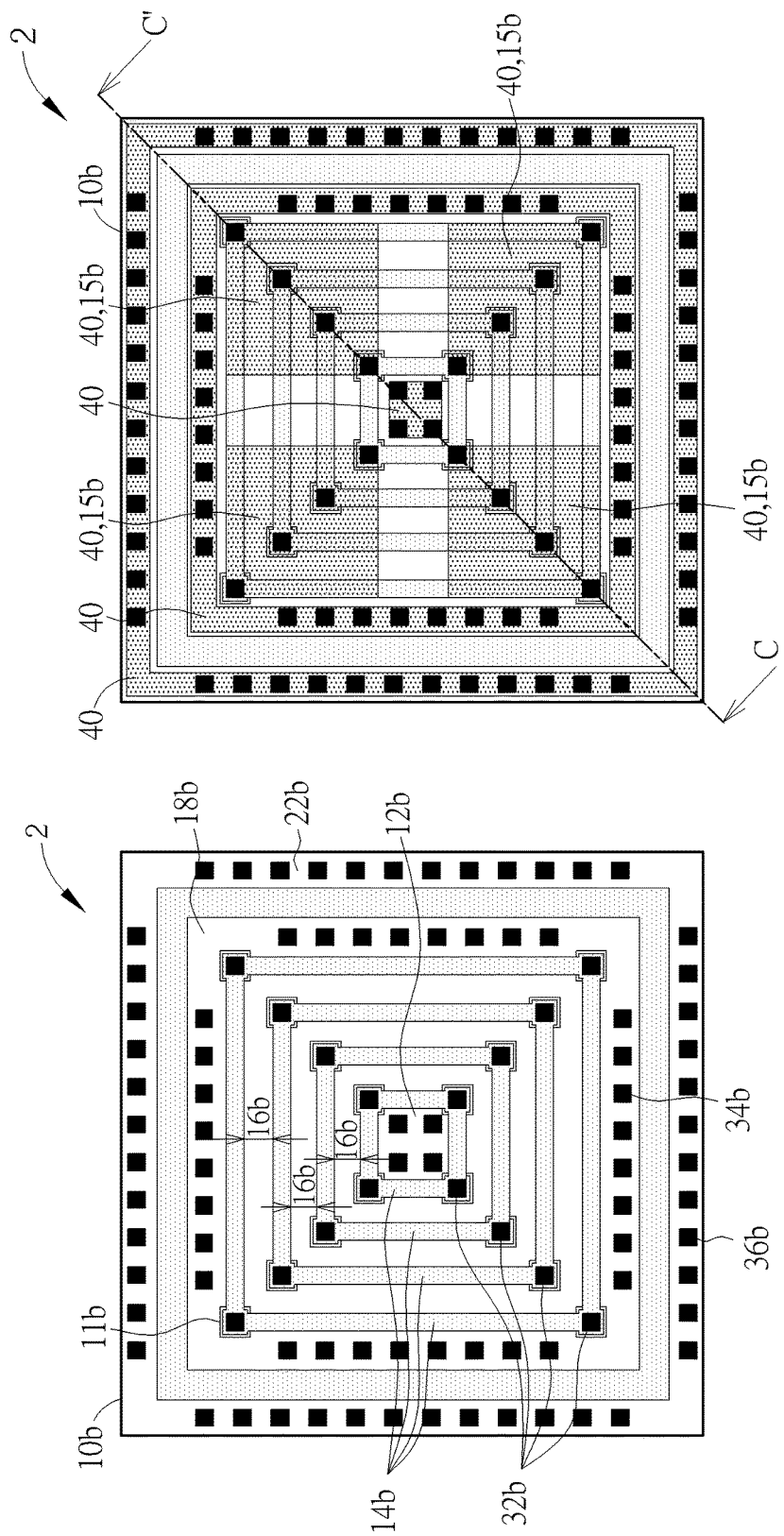
Figure 10:
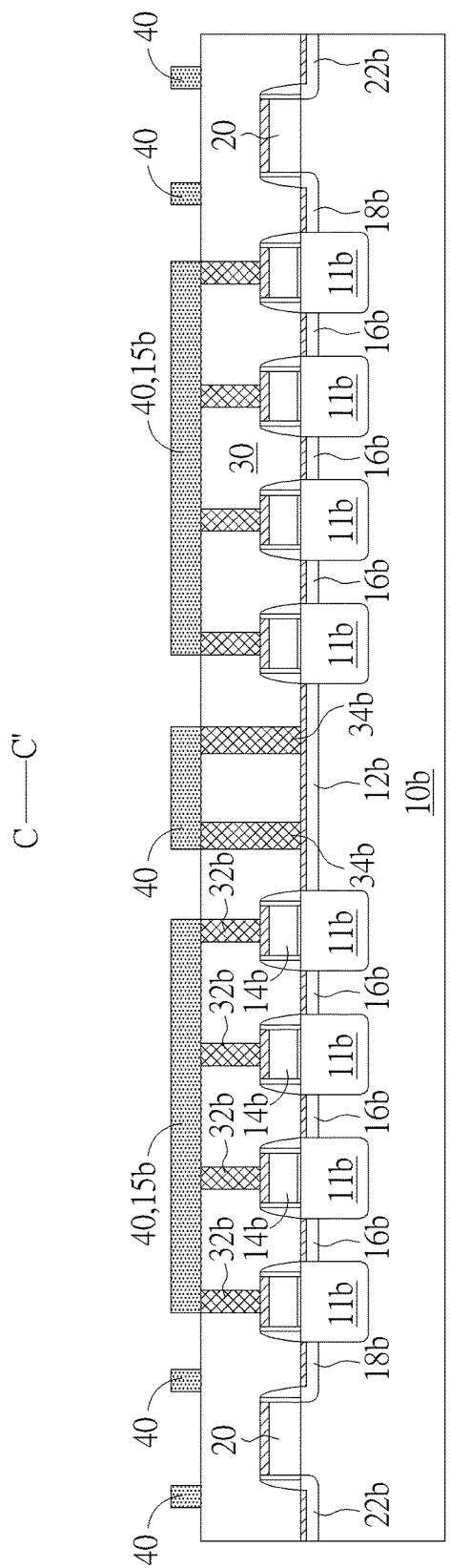

FIG. 9 and FIG. 10 are the layout views and the corresponding cross-sectional view of a modification of the second embodiment. FIG. 10 is a cross-sectional view taken along line C-C' in the layout view of FIG. 9

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
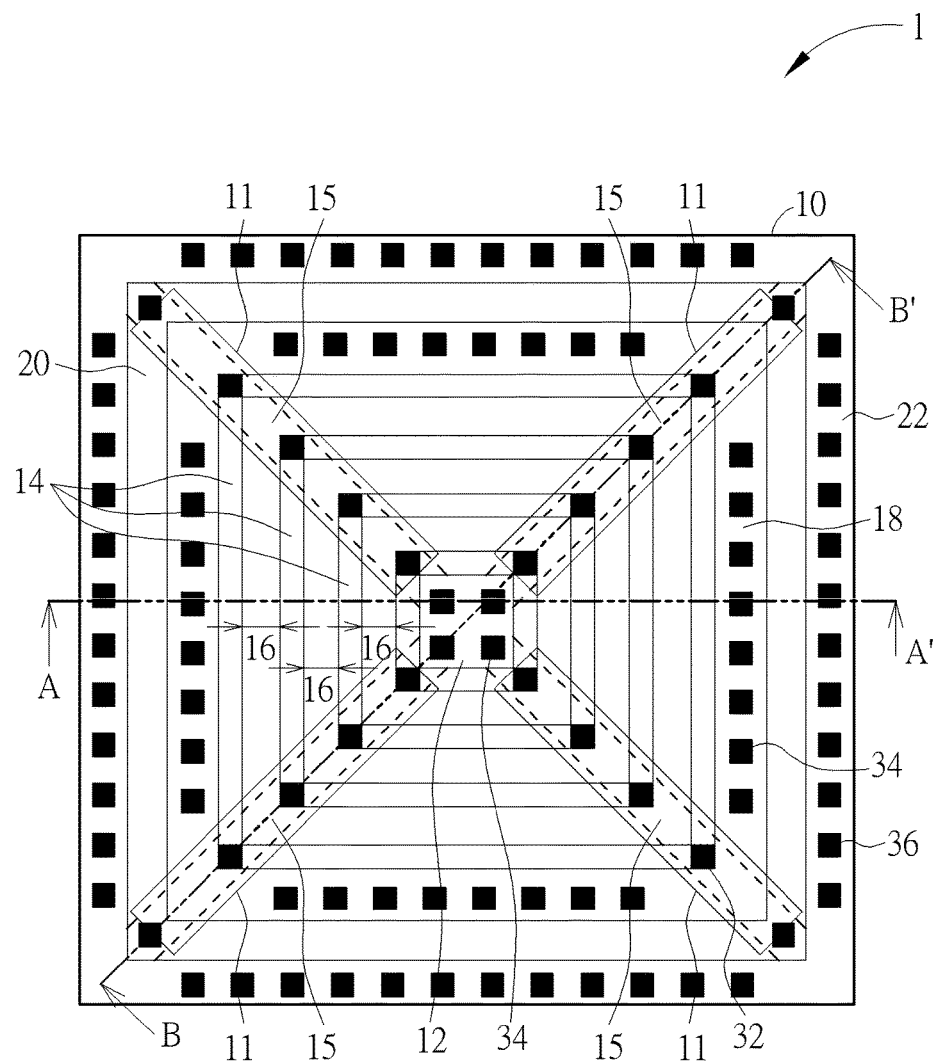
Figure 2:
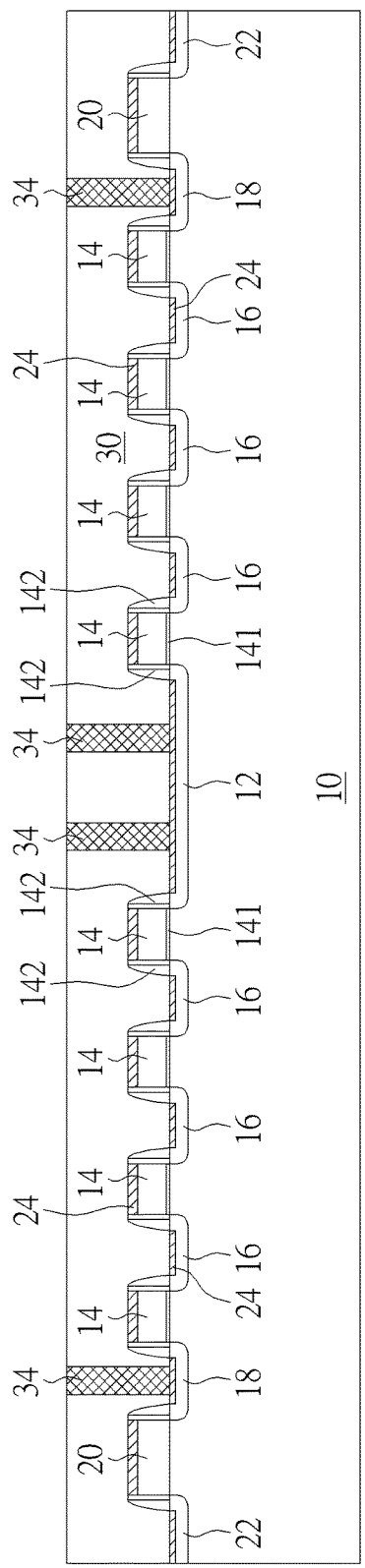
Figure 3:
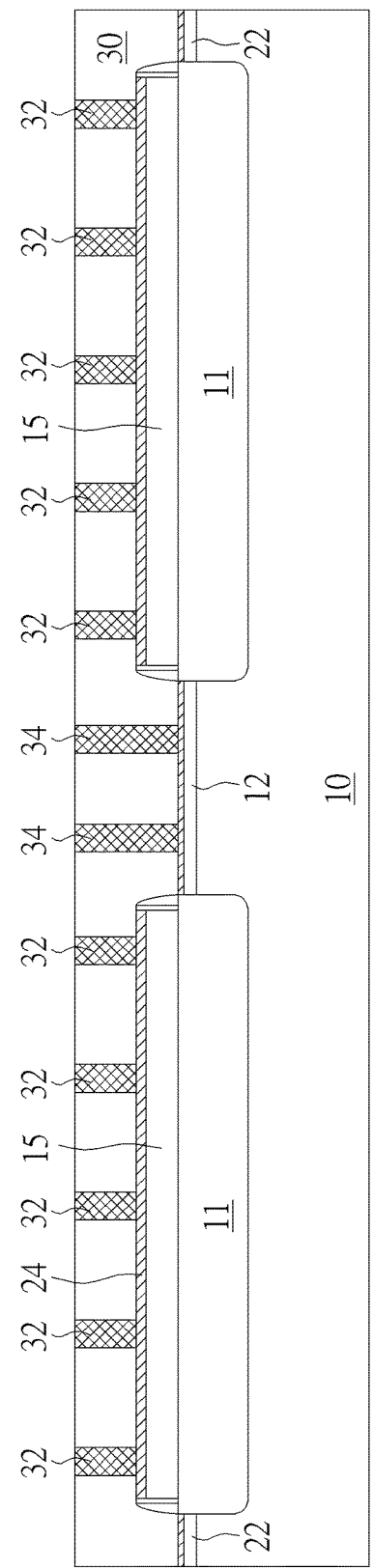

Please refer to FIG. 1 to FIG. 3. The following description is presented for an understanding of the semiconductor device 1 mainly in the respect of the layout view. According to the first embodiment, the semiconductor device 1 is formed in a substrate 10 with a first conductivity type, for example, a P-type substrate. The substrate 10 may be a bulk silicon substrate, an epitaxial silicon substrate, a silicon germanium substrate, a silicon carbide substrate or a silicon-on-insulator substrate (SOI), but not limited thereto. A first doping region 12 with a second conductivity type opposite to the first conductivity type is formed in the substrate 10, for example, a N-type first doping region 12. A plurality of gate rings 14 are formed on the substrate 10, concentrically surrounding the first doping region 12 and are spaced apart from each other by a second doping region 16 formed in the substrate 10 and interposed between each two adjacent gate rings 14. A third doping region 18 is formed in the substrate 10 adjacent to the outer perimeter of the outermost gate ring 14. The second doping regions 16 and the third doping region 18 have the conductivity type the same as the first doping region 12. It is noteworthy that in the layout view, the gate rings 14, the second doping regions 16 and the third doping region 18 are all square rings and are arranged concentrically surrounding the first doping region 12 in the center. The shape of the first doping region 12 is square. The number of the gate rings 14 may be adjusted according to application and design needs. Preferably, the number of the gate rings 14 may range from 4 to 20.

The semiconductor device 1 further comprises a plurality of source/drain (S/D) contact plugs 34 and gate contact plugs 32 formed in an interlayer dielectric layer 30 (shown in FIG. 2 and FIG. 3) over the substrate 10. As shown in FIG. 1 and FIG. 2, the S/D contact plugs 34 are formed directly over the first doping region 12 and the third doping region 18. As shown in FIG. 1 and FIG. 3, the gate contact plugs 32 are formed directly on each corner of the gate rings 14. Through the S/D contact plugs 34 and gate contact plugs 32, respective external bias voltage may be applied to the first doping region 12, the third doping region 18 and the gate rings 14, wherein the first doping region 12 and the third doping region 18 are the S/D regions of the semiconductor device 1, and the gate rings 14 are the controlling gates. It is noteworthy that the second doping regions 16 do not have any contact plugs formed thereon and therefore do not electrically connect to any external bias voltage. The second doping regions 16 are electrically floating.

The semiconductor device 1 further comprises a guard ring 20 formed on the substrate 10 and adjacent to the outer perimeter of the third doping region 18. The guard ring 20 is formed in the same material layer as the gate rings 14. According to the embodiment, the guard ring is formed structurally integrated with the gate rings 14 and is also a square ring. The guard ring 20 does not function as a controlling gate. Instead, the guard ring 20 may be considered as a dummy gate for eliminating the proximity effect to obtain a pattern of gate rings 14 with a more uniform profile. Moreover, similar to the gate rings 14, the guard ring 20 may additionally function as a mask layer in the subsequent self-aligned process, such as the self-aligned implantation processes to form the first doping region 12, the second doping regions 16 and the third doping region 18, or the self-aligned silicidation process to form the silicide 24 (shown in FIG. 2). In another embodiment, a corresponding square-ring shaped isolation structure (not shown) may be formed in the substrate 10 directly underlying the square-ring shaped guard ring 20 for a better isolation between the semiconductor device 1 and the peripheral circuit.

The semiconductor device 1 further comprises at least a connecting structure 15 formed on the substrate 10, equipotentially connecting each of the gate rings 14. In the first embodiment, the connecting structure 15, the gate rings 14 and the guard ring 20 are formed structurally integrated in same material layer and comprise the same material. According to the embodiment, the semiconductor device 1 comprises an even number of connecting structures 15, which are particularly arranged in a radical-symmetrical manner around the first doping region 12. Preferably, as shown in FIG. 1, the semiconductor device 1 comprises 4 connecting structures 15, wherein each of the connecting structures 15 is oriented along a diagonal line of the concentric square gate rings 14 with a distal end joined with the innermost gate ring 14 while the other distal end joined with the outermost guard ring 20. According to the first embodiment, each connecting structure 15 extends from the innermost gate ring 14 to the guard ring 20 and intersects with each gate ring 14 at the corners. As shown in layout view, the connecting structures 15 have an X shape joined at the innermost gate ring 14. The gate contact plugs 32 are only disposed on the corners of each gate ring 14 and the guard ring 20, in other words, only on the regions intersecting (or overlapping) with the connecting structures 15. A larger alignment margin for the gate contact plugs 32 may be obtained for the diagonally oriented connecting structures 15, and may provide extra diagonal enclosure areas whereon the gate contact plugs 32 may land. The gate contact plug 32 is not formed on any other areas of the gate rings 14 and the guard ring 20.

The semiconductor device 1 further comprises an isolation structure 11, for example, a shallow trench isolation structure (STI), formed in the substrate 10 aligning with and underlying each connecting structure 15 correspondingly. The number of the isolation structures 11 and the connecting structures 15 are the same. It should be noticed that in the layout view, each connecting structure 15 is completely within the area of each isolation structure 11. The length and the width of the isolation structure 11 may be equal to or larger than which of the connecting structure 15. In this way, it is ensured that each connecting structure 15 may not overlap on any region of the first doping region 12, the second doping regions 16 and the third doping region 18. Because the isolation structure 11 is also oriented along a diagonal line of the semiconductor device 1, the second doping regions 16 and the third doping region 18 are consequently divided by the isolation structures 11 into discrete trapezoid segments and become discontinuous square rings. Similarly, the isolation structures 11 also have an X shape aligning with the connecting structures 15.

The semiconductor device 1 further comprises a fourth doping region 22 formed in the substrate 10, adjacent to the outer perimeter of the guard ring 20. The fourth doping region 22 has the conductivity type same as the substrate 10. A plurality of substrate contact plugs 36 may be formed on the fourth doping region 22 to electrically connect the substrate 10 with an external bias voltage.

The following description is presented for a further understanding of the semiconductor device 1 mainly in the respect of its cross-sectional structure.

Please refer to FIG. 2. The first doping region 12 is formed in the substrate 10, covered by the interlayer dielectric layer 30 over the substrate 10. The gate rings 14 and a guard ring 20 are formed on the substrate 10, arranged symmetrically at the two sides of the first doping region 12. The gate rings 14 are located between the first doping region 12 and the guard ring 20. A second doping region 16 is formed in the substrate 10, interleaved between two adjacent gate rings 14. The gate rings 14 are completely separated from each other by the second doping regions 16. The third doping region 18 is formed in the substrate 10 between the outermost gate ring 14 and the guard ring 20, and adjacent to the inner perimeter of the guard ring 20. The fourth doping region 22 is formed in the substrate 10 adjacent to the outer perimeter (opposite to the inner perimeter) of the guard ring 20. The first doping region 12, the second doping regions 16, the third doping region 18 and the fourth doping region 22 are all exposed from the upper surface of the substrate 10, wherein the first doping region 12 and the third doping region 18 have the S/D contact plugs 34 formed thereon, and the fourth doping region 22 has the substrate contact plugs 36 (shown in FIG.

1) formed thereon. Differently, the second doping regions 16 do not have any contact plug formed thereon. In other words, the second doping regions 16 are completely covered by the interlayer dielectric layer 30 and the spacers 142. A gate dielectric layer 141 may be formed between the substrate 10 and each gate ring 14. The gate dielectric layer 141 may comprise oxide, nitride or high-k dielectric material, but not limited thereto. The spacers 142 are formed on the sidewalls of each gate ring 14 and the guard ring 20, and covering a portion of the first doping region 12, the second doping regions 16, the third doping region 18 and the fourth doping region 22. The spacers 142 may have single layer or multi layers, comprising silicon oxide, silicon nitride or silicon oxycarbonitride (SIOCN), but not limited thereto. The guard ring 20 is directly formed on the substrate 10. In another embodiment as mentioned previously, a corresponding square-ring shaped isolation structure (not shown) may be formed in the substrate 10 underlying the square-ring shaped guard ring 20 to provide a better isolation. The gate dielectric layer 141 between the guard ring 20 and the substrate 10 may be omitted optionally.

Now please refer to FIG. 3. Each connecting structure 15 extends from the innermost gate ring 14 to the guard ring 20. The two distal ends of each connecting structure 15 are adjacent to the first doping region 12 and the fourth doping region 22 respectively, and also have spacers 142 formed thereon. The isolation structure 11 in the substrate 10 may have a length the same as or a slightly longer than the length of the corresponding connecting structure 15. The two distal ends of the isolation structure 11 are adjacent to the first doping region 12 and the fourth doping region 22. It should be understood that the locations where the gate contact plugs 32 landing on are the intersecting areas (or overlapping areas) of the connecting structure 15, the gate rings 14 and the guard rings 20.

Figure 4:
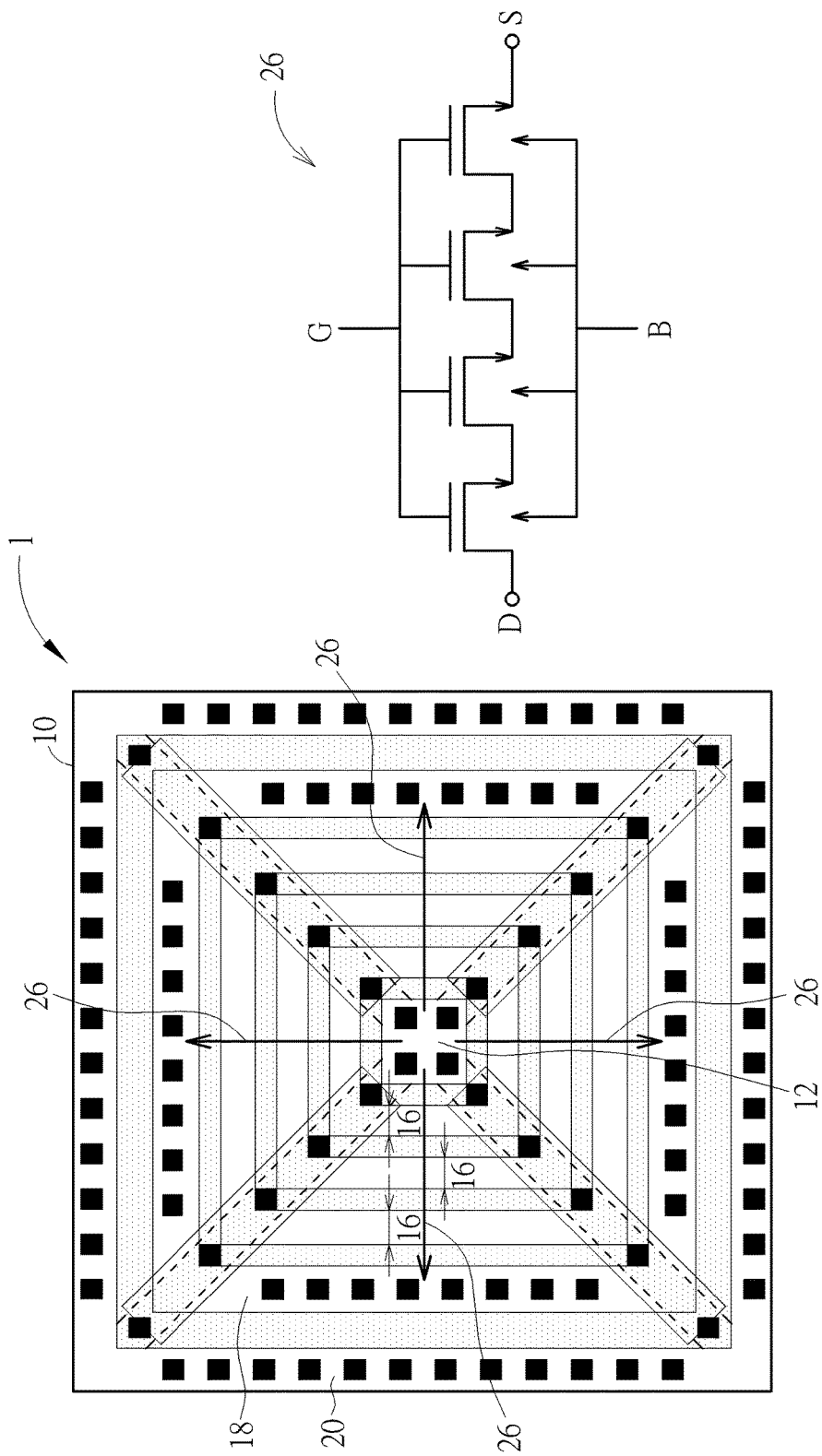
FIG. 4 schematically shows the current paths of the semiconductor device as shown in FIG. 1 and the equivalent circuit of each current path.
Figure 5:
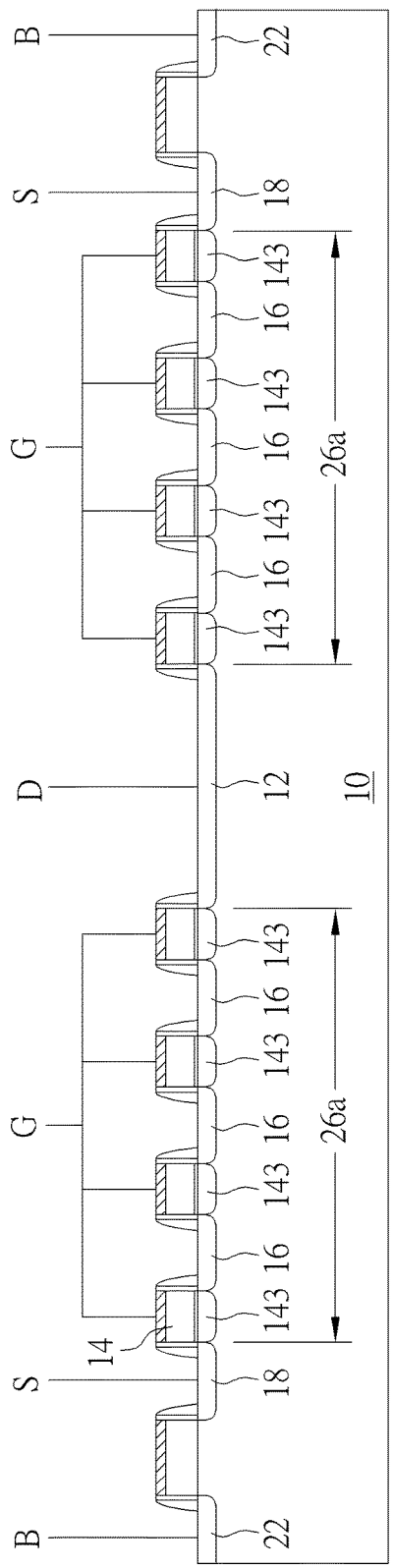
FIG. 5 is a cross-sectional view along a line parallel with the directions of two opposite current paths in FIG. 4.

Please refer to FIG. 4, illustrating the current paths 26 and the simplified equivalent circuit of each current path when the semiconductor device according to the present invention is in an "on" state. FIG. 5 is a cross-sectional diagram taken along the direction of two opposite current paths 26. The layout view shown in the left part of FIG. 4 is substantially the same as the layout shown in FIG. 1, wherein some reference numbers of the same features are omitted in FIG. 4 for the sake of simplicity.

As shown in FIG. 4, when the first doping region 12 and the third doping region 18 are respectively biased by a drain voltage D and a source voltage S, the gate rings 14 are synchronously and equipotentially biased with a gate voltage G, and the fourth doping region 22 is biased with a substrate voltage B, and the channel 26a in the substrate 10 under the gate rings 14 and between the first doping region 12 (the drain region) and the third doping region 18 (source region) are conducted, forming multiple synchronous, parallel-connected current paths 26, allowing the on-current (or electron flow) flowing from the first doping region 12 (the drain region) to the third doping region 18 (source region) in different directions. As shown in the embodiment, the semiconductor device 1 has four gate rings 14, so that each current path 26 substantially comprises four stacked gates therefore four gate regions 143 serial-connected by the interposing second doping regions 16 in the on-current direction. In other words, when the semiconductor device 1 is properly biased to be turned on, the interleaving gate regions 143 and second doping regions 16 collectively form contentious channel regions 26a, allowing a larger on-current to flow from the drain region to the source region through multiple current paths with different directions. In another embodiment when the central first doping region 12 is the source region and the surrounding third doping region 18 is the drain region, multiple current paths may also be formed to provide a larger on-current.

One feature of the present invention is that in each current path, the second doping regions 16 are utilized to interconnect each gate region 143, to form a contentious channel region 26a. In this way, the semiconductor device 1 may have the S/D contact plugs 34 only formed on the central and peripheral S/D regions, consequently having a lower contact plug density and lower gate-to-contact parasitic capacitance. Another feature of the present invention is that the semiconductor device 1 may provide multi-directional, simultaneously conducted current paths 26, and therefore a lower on-resistance and a larger on-current may be obtained. Furthermore, unlike conventional devices having the source/drain regions formed symmetrically at two sides of the gate, the present invention has the S/D region formed asymmetrically wherein the drain region is in the center of the semiconductor device, being surrounded by the gate rings and the source region. The asymmetric source/drain structure may have a smaller junction area and therefore a smaller parasitic junction capacitance. By these advantages including lower parasitic capacitance, lower on-resistance and larger on-current, the semiconductor device 1 according to the present invention may have an overall improved performance. Furthermore, a plurality of semiconductor devices 1 may be interconnected to form an array for specific performance requirement conveniently by forming a conventional metallic interconnection system.

Figure 6:
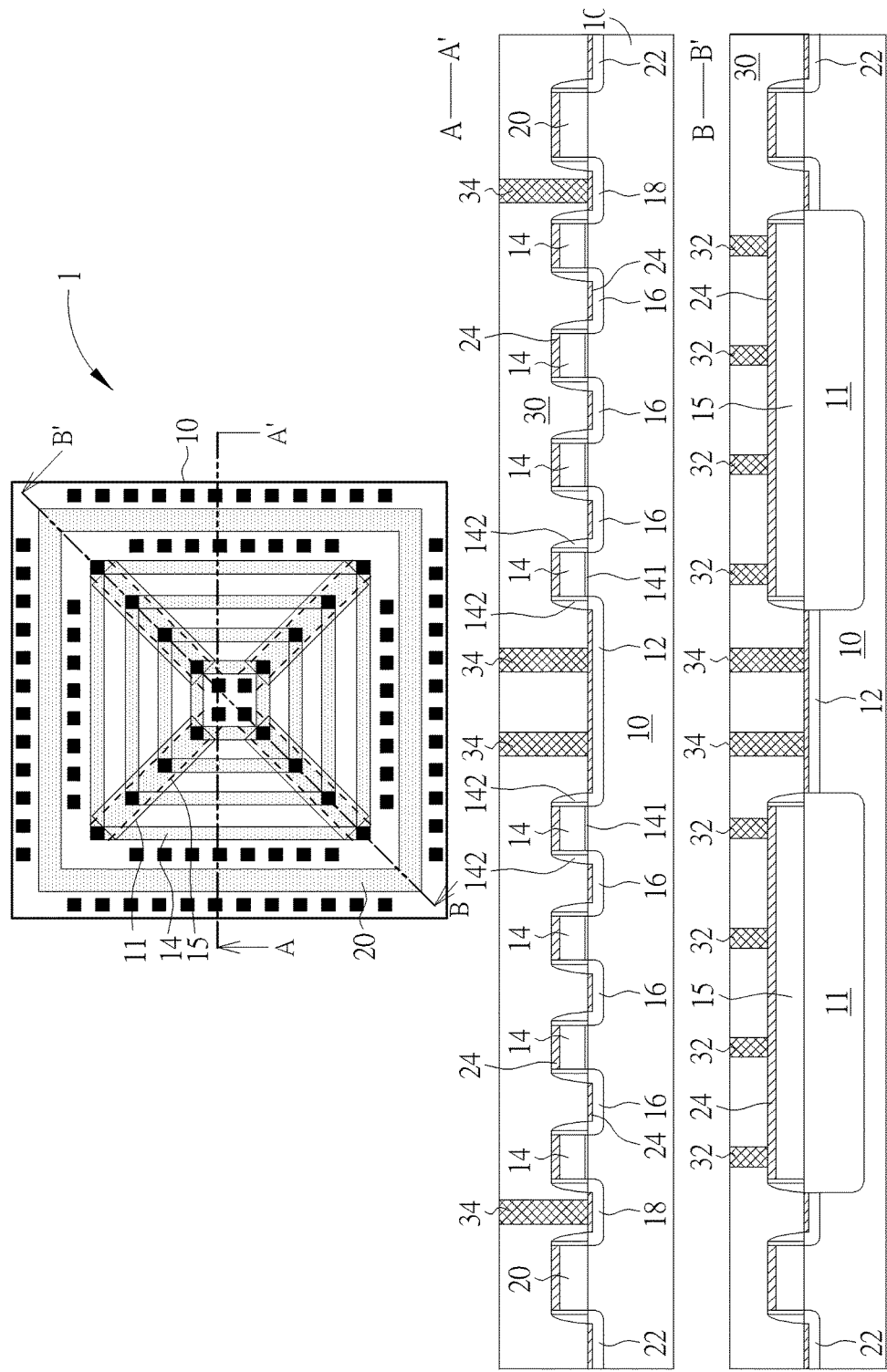
FIG. 6 is a modification of the first embodiment. The upper part of FIG. 6 is a layout view, and similarly, the lower part are cross-section views taken along a line A-A' and a B-B' in the layout view respectively.

Please refer to FIG. 6, showing a modification of the first embodiment. Some reference numbers of the same elements as shown in FIG. 1 to FIG. 3 are omitted for the sake of simplicity. Likely, the connecting structures 15 in FIG. 6 are formed structurally integrated with the gate rings 14 in the same material layer, but each connecting structure 15 in FIG. 6 extends from the innermost gate ring 14 to the outermost gate ring 14. The connecting structures 15 in FIG. 6 do not extend across the third doping region 18 to connect with the guard ring 20. Similarly, each isolation structure 11 corresponding to each connecting structure 15 only extends from the innermost gate ring 14 to the outermost gate ring 14, and therefore the third doping region 18 in FIG. 6 is not divided into discrete segments by the isolation structures 11. The third doping region 18 in FIG. 6 is a contentious square ring. The gate contact plugs 32 are formed directly on each intersecting (or overlapping) region of the connecting structures 15 and the gate rings 14. The guard ring 20 in FIG. 6 neither has any contact plug formed thereon nor electrically connects to any other structures. The guard ring 20 in FIG. 6 is completely covered by the interlayer dielectric layer 30 and is electrically floating.

Figure 7:
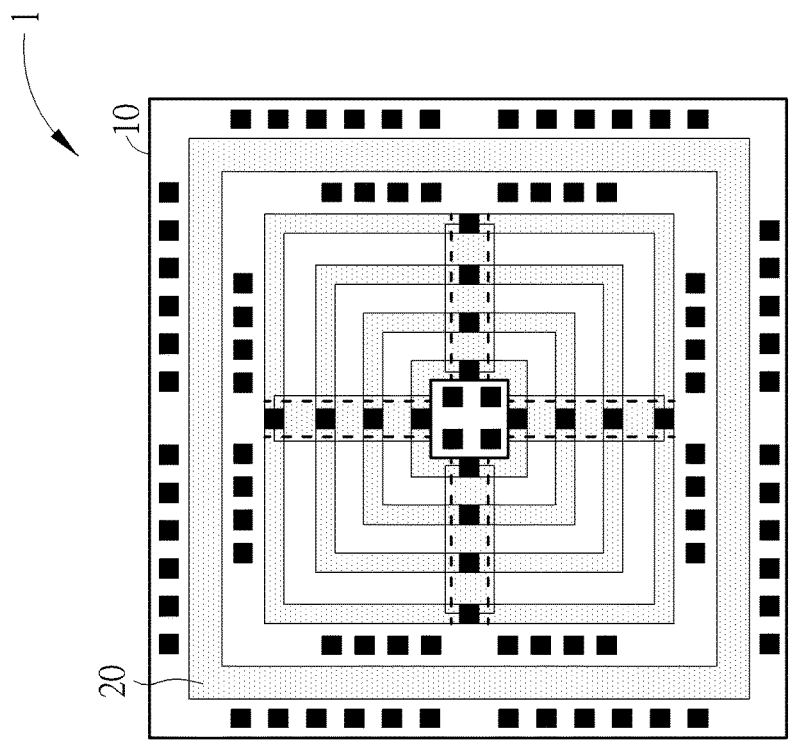
FIG. 7 further shows two modifications of the first embodiment.
Figure 7:
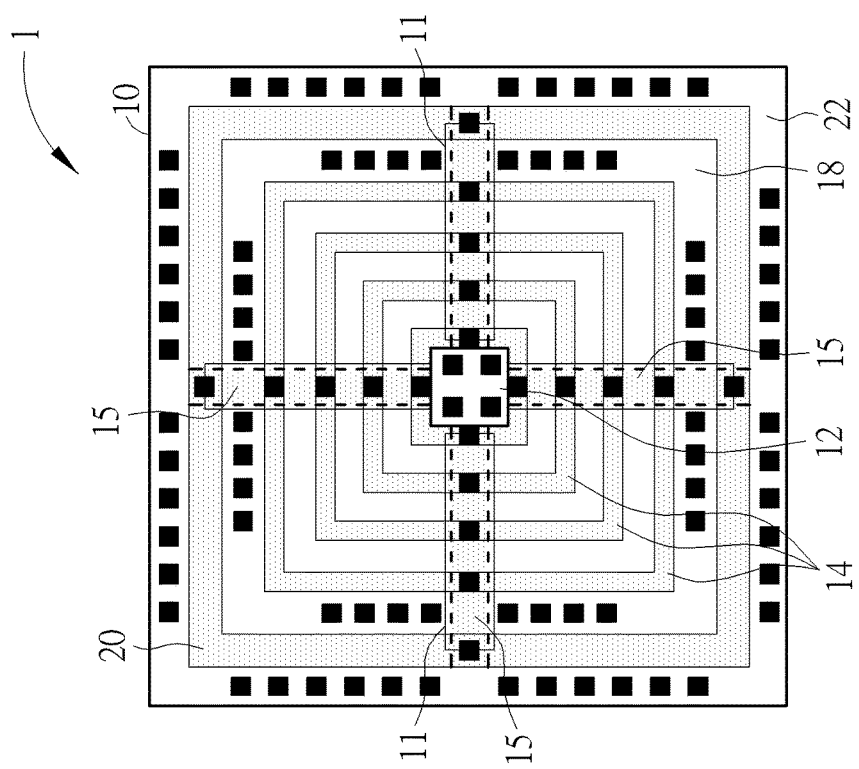

Please refer to FIG. 7, further showing two modifications of the first embodiment. Some reference numbers of the same elements as shown in FIG. 1 are omitted for the sake of simplicity. The connecting structures 15 in the two modifications as shown in the left part and right part of FIG. 7 are also formed structurally integrated with the gate rings 14 in the same material layer, and are arranged radial-symmetrically around the first doping region 12. Differently, the connecting structures 15 in FIG. 7 are oriented along the orthogonal directions of the gate rings 14, and consequently form a cross shape joined by the innermost gate ring 14 in the layout view. Similarly, each connecting structure 15 may extend from the innermost gate ring 14 to the outermost gate ring 14, or extend to the guard ring. Isolation structures 11 may be formed correspondingly in the substrate 10 aligning with and underlying the connecting structures 15.

Figure 8:
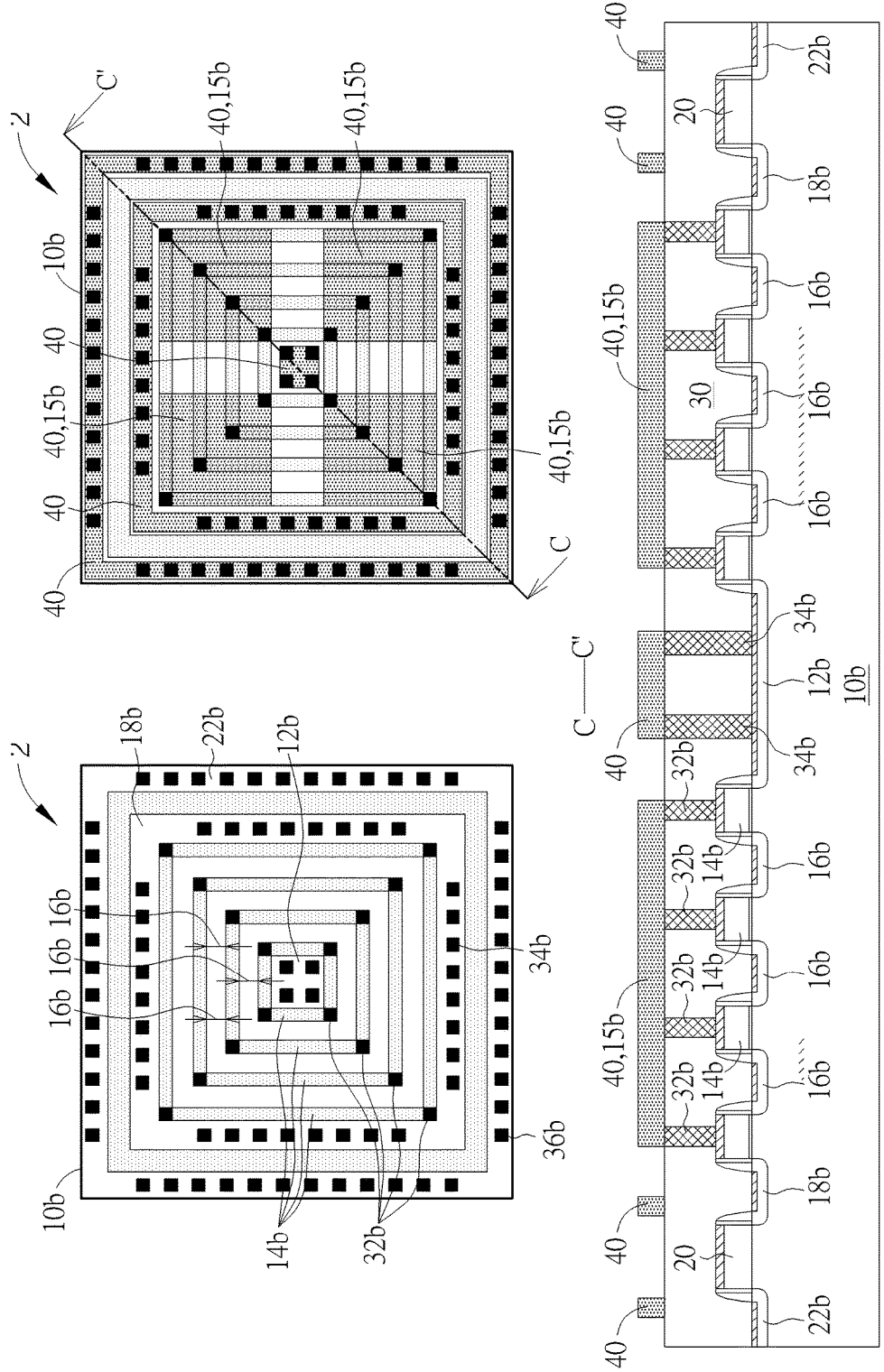

Please refer to FIG. 8, showing a semiconductor device 2 according to a second embodiment of the present invention. The difference between the first embodiment and the second embodiment is that, the connecting structures 15b of the semiconductor device 2 as shown in FIG. 8 are formed in another material layer, not formed structurally integrated with the gate rings 14b in the same material layer. Please refer to the upper-right and lower parts of FIG. 8, the connecting structures 15b may be formed in a metal layer, for example, the first metal layer 40 of the interconnecting structure (not shown). The connecting structures 15b equipotentially interconnect each gate rings 14b through the gate contact plugs 32b on the corners of each gate ring 14b. The isolation structure corresponding to each connecting structure 15b is omitted in FIG. 8. As shown in the upper-left part of FIG. 8, the second doping regions 16b and the third doping region 18b are not divided into discrete segments and are contentious rings.

Please refer to FIG. 9 and FIG. 10, showing a modification of the semiconductor device 2 of the second embodiment. Differently, the gate rings 14b in FIG. 9 may have a narrower line width. The corner of each gate rings 14b whereon the gate contact plugs 32b are disposed may be enlarged areas according to the dimension of the gate contact plugs 32b. In this way, the gate contact plugs 32b may have a larger alignment margin to completely land on the corners of the gate rings 14b, and the risk of direct shorting between the gate contact plugs 32b and the first doping region 12b, the second doping regions 16b or the third doping region 18b may be avoided. The semiconductor device 2 in FIG. 9 may comprise an isolation structure 11b formed in the substrate 10b, corresponding to each gate contact plug 32b and underlying each corner of the gate rings 14b. The isolation structures 11b may have areas larger than the corners of the gate rings 14b to encompass the corners of the gate rings completely. In this way, the alignment margin of forming the gate contact plugs 32b is further enlarged.

The semiconductor device according to the present invention may have a larger on-current and smaller on-resistance by multi-directional and parallel-connected current paths, a smaller gate-to-contact parasitic capacitance by forming in each current path a serial-connected stacked gate channel by the interposing doping regions, avoiding the need to form contact plugs between the gate rings. Additionally, the semiconductor device according to the present invention has asymmetric source/drain regions and may have a smaller junction capacitance. Advantageously, an overall optimized performance may be achieved and may be more appropriately applied in the analog/RF field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first doping region formed in the substrate;
   a plurality of gate rings formed on the substrate, concentrically surrounding the first doping region and spaced apart from each other by a second doping region formed in the substrate and between each two adjacent gate rings, wherein the gate rings are equipotentially interconnected by at least a connecting structure;
   a third doping region formed in the substrate and adjacent to the outer perimeter of the outermost gate ring; and
   a guard ring disposed adjacent to the outer perimeter of the third doping region and encompassing the gate rings, wherein the first doping region, the third doping region and the gate rings are electrically connected to respective external bias voltages and the second doping region is electrically floating.

2. The semiconductor device according to claim 1, further comprising a silicide layer formed on the first doping region, the second doping region, the gate rings and the third doping region.

3. The semiconductor device according to claim 1, further comprising a plurality of source/drain contact plugs formed on the first doping region and the third doping region.

4. The semiconductor device according to claim 1, wherein the first doping region and the third doping region are the source/drain regions of the semiconductor device.

5. The semiconductor device according to claim 1, further comprising a fourth doping region formed in the substrate, adjacent to the outer edge of the guard ring.

6. The semiconductor device according to claim 1, wherein the semiconductor device is a RF device.

7. The semiconductor device according to claim 1, wherein the number of the gate rings is from 4 to 20.

8. The semiconductor device according to claim 1, wherein the gate rings are square rings.

9. The semiconductor device according to claim 1, wherein an even number of the connecting structures are arranged in a radial-symmetric manner, and each connecting structure extends from the innermost one to the outermost one of the plurality of gate rings.

10. The semiconductor device according to claim 9, wherein the connecting structure is formed in a metal layer.

11. The semiconductor device according to claim 9, wherein the even number is 4.

12. The semiconductor device according to claim 11, wherein the connecting structures are arranged in a cross shape.

13. The semiconductor device according to claim 11, wherein the connecting structures are arranged in an X shape.

14. The semiconductor device according to claim 9, wherein the gate rings and the connecting structures are formed structurally integrated.

15. The semiconductor device according to claim 14, further comprising a gate contact plug disposed on each intersecting region of the gate rings and the connecting structures.

16. The semiconductor device according to claim 14, wherein the guard ring is formed is formed process integrated with the gate rings and comprising the same material.

17. The semiconductor device according to claim 16, wherein each connecting structure extends from the innermost gate ring to the guard ring.

18. The semiconductor device according to claim 14, wherein an isolation structure is formed in the substrate and directly underlying each connecting structure.

19. The semiconductor device according to claim 18, wherein each connecting structure does not overlap on any portion of the second doping region.

20. The semiconductor device according to claim 18, wherein the second doping region is a discontinuous square ring.

* * * * *